United States Patent [19]
Lee

[11] Patent Number: 6,094,154
[45] Date of Patent: Jul. 25, 2000

[54] ANALOG-TO-DIGITAL CONVERTER

[75] Inventor: Sang Yoon Lee, Seoul, Rep. of Korea

[73] Assignee: LG Semicon Co., Ltd., Chungcheongbuk-Do, Rep. of Korea

[21] Appl. No.: 09/179,849

[22] Filed: Oct. 28, 1998

[30] Foreign Application Priority Data

Jan. 13, 1998 [KR] Rep. of Korea .......................... 98-736

[51] Int. Cl.[7] ................................................... H03M 1/38
[52] U.S. Cl. ........................................... 341/161; 341/155
[58] Field of Search .................................. 341/163, 165, 341/155, 161

[56] References Cited

U.S. PATENT DOCUMENTS

| | | | |
|---|---|---|---|
| 4,829,302 | 5/1989 | Oitzl et al. | 341/165 |
| 4,897,658 | 1/1990 | Fujii et al. | 341/161 |
| 5,252,976 | 10/1993 | Miho et al. | 341/163 |
| 5,543,795 | 8/1996 | Fernald | 341/163 |

*Primary Examiner*—Michael Tokar
*Assistant Examiner*—Peguy JeanPierre
*Attorney, Agent, or Firm*—Morgan, Lewis & Bockius LLP

[57] ABSTRACT

An analog-to-digital converter includes a sample and hold circuit for sampling and holding an input analog signal and outputting an analog voltage, a selection code generator for generating a selection code corresponding to an operation mode for a number of conversion bits and a number of samples, a decoder for generating an enable signal corresponding to the selection code, a comparator for comparing an external voltage with the analog voltage and outputting a digital value, a conversion data register for storing the digital value and outputting a final digital value, a digital-to-analog converter for outputting the external voltage by inputting the digital value and a reference voltage stored in the ADR, a multiplexer for selecting a signal path for the operation mode selected by the selection code generator, a shift register for determining a number of registers for the operation mode selected by the selection code generator, a counter for counting a number of shifts of the shift register and determining the signal path of the multiplexer, an output detector for detecting a conversion value of a lowest bit of the conversion data register and outputting a conversion end signal to the conversion data register, and a controller for controlling operation of the A/D converter by outputting a clock signal in response to the selection code and the conversion end signal.

9 Claims, 5 Drawing Sheets

FIG.5

| shift register \ N | 8 | 4 | 2 | 1 |
|---|---|---|---|---|
| 8 | (1) | X | X | X |
| 4 | (2) | (1) | X | X |
| 2 | (4) | (2) | (1) | X |
| 1 | (8) | (4) | (2) | (1) |

…

ANALOG-TO-DIGITAL CONVERTER

This application claims the benefit of Korean patent application No. 736/1998, filed Jan. 13, 1998, which is hereby incorporated by reference.

BACKGROUND OF THE INVENTION

1. Field of the Invention

The present invention relates to an analog-to-digital (A/D) converter, and more particularly, to an A/D converter with lower fabricating cost and improved reliability.

2. Discussion of the Related Art

Generally, A/D converters are divided into integrated types and comparison types. The A/D converter of the comparison type includes a feedback comparison type, which is representative of a successive-approximation type A/D converter, and a non-feedback comparison type, which is representative of a parallel comparison type A/D converter. The A/D converter of the successive-approximation type includes a digital-to-analog (D/A) converter and compares an input analog signal with an output of the D/A converter to have the output of the D/A converter coincide with an input analog signal.

FIG. 1 is a block diagram illustrating a conventional A/D converter of the successive-approximation type, FIG. 2 is a circuit diagram illustrating a comparator of a conventional A/D converter of the successive-approximation type, and FIG. 3 is a flow chart illustrating operation of the conventional A/D converter of the successive-approximation type.

As shown in FIG. 1, the conventional A/D converter of the successive-approximation type includes a sample-and-hold (S/H) circuit 11, a comparator 12, a successive-approximation register (SAR) 13, a D/A converter 14, a controller 15, and an output detector 16. The S/H circuit 11 samples and holds the input analog signal and outputs an input analog voltage $V_{AN}$. The SAR 13 stores digital values of the comparator 12 and outputs a final digital value by inputting the output of the output detector 16. The D/A converter 14 receives a reference voltage Vref and the digital values of the SAR 13, and outputs a digital-to-analog voltage $V_{D/A}$, which will be compared with $V_{AN}$ by decoding the digital values.

As shown in FIG. 2, the comparator 12 includes a first transfer gate 17 to which $V_{AN}$ is input, a second transfer gate 18 to which $V_{D/A}$ is input, a capacitor 19 to which the outputs of the first and second transfer gates 17 and 18 are input, a third transfer gate 20 to which the output of the capacitor 19 is input, and a CMOS inverter 21. The comparator 12 compares $V_{D/A}$ with $V_{AN}$ and outputs a digital value.

An operational amplifier whose negative (−) terminal is connected to $V_{D/A}$ and whose positive (+) terminal is connected to the output data of the S/H circuit 11 may also serve as the comparator 12.

The controller 15 outputs a clock signal and an enable signal to control operation of the A/D converter by inputting the output data from a register controlled by a user as well as the output data of the output detector 16.

The output detector 16 detects a conversion value of the lowest bit of the SAR 13 by inputting the digital values of the SAR 13, and outputs a conversion end signal.

If the conventional A/D converter of the successive-approximation type as described above is N-bit in hardware, the conversion time is N clock periods.

The operation of the conventional A/D converter of the successive-approximation type will be described with reference to FIG. 3. If all operations are controlled by the controller 15, it is assumed that the A/D converter is N bit, and $V_{AN}$ is in a verse 0–Vref. If the second transfer gate 18 is turned off, the S/H circuit 11 samples and holds $V_{AN}$, and the comparator 12 is initiated.

During the first clock period, the A/D converter operates as follows:

The digital value of the SAR 13 is 100 . . . 000 (N-bits). This digital value is converted into $V_{D/A}$, i.e, Vref/2, by the D/A converter 14 in step 100. If the comparator 12 compares $V_{D/A}$ with $V_{AN}$ in step 200, a high value or a low value is obtained. In other words, if the output of the comparator 12 is high, that is, $V_{AN} < V_{D/A}$, the highest bit of the SAR 13 becomes "0" in step 300. If the output of the comparator 12 is low, that is, $V_{AN} > V_{D/A}$, the highest bit of the SAR 13 becomes "1" in step 400.

When the output of the comparator 12 is low, the digital value of the SAR 13 is 100 . . . 000. $V_{D/A}$ is converted into Vref/2+Vref/4 by the D/A converter 14 in step 500. When the output of the comparator 12 is high, the digital value of the SAR 13 is 000 . . . 000. $V_{D/A}$ is converted into Vref/2−Vref/4 by the D/A converter 14 in step 600.

During the second clock period, the A/D converter operates as follows:

First, if the resulting value of the digital value of the SAR 13 in the first clock period is 100 . . . 000, the digital value of the SAR 13 becomes 110 . . . 000 and $V_{D/A}$ is Vref/2+Vref/4. The comparator 12 compares $V_{D/A}$ with $V_{AN}$ in step 200. As a result, a high value or a low value is obtained.

If the output of the comparator 12 is high, the digital value of the SAR 13 becomes 100 . . . 000. If the output of the comparator 12 is low, the digital value of the SAR 13 becomes 110 . . . 000.

Meanwhile, if the resulting value of the digital value of the SAR 13 in the first clock period is 000 . . . 000, the digital value of the SAR 13 becomes 010 . . . 000 and $V_{D/A}$ is Vref/2−Vref/4. The comparator 12 compares $V_{D/A}$ with $V_{AN}$ in step 200. As a result, a high value or a low value is obtained. If the output of the comparator 12 is high, the digital value of the SAR 13 is 000 . . . 000. If the output of the comparator 12 is low, the digital value of the SAR 13 is 010 . . . 000.

If the above steps are repeated N times in an N-bit A/D converter, the digital value of N bits can be obtained.

If (N+1)th clock period signal is generated in step 800, the conversion end signal is generated by the output detector 16 and the digital value is output by the SAR 13. Thus, the operation of the A/D converter ends.

The conventional A/D converter has a number of problems.

In the conventional A/D converter, the number of conversion bits is determined in hardware, the number of conversion operations required is equal to the number of conversion bits N and is defined by the hardware even if a smaller number of conversion bits is required. This increases conversion time, and increases a number of switching operations of the transfer gate which receives the output of the D/A converter, thereby causing charge injection. As a result, reliability of the A/D converter is reduced.

SUMMARY OF THE INVENTION

Accordingly, the present invention is directed to an analog-to-digital converter that substantially obviates one or more of the problems due to limitations and disadvantages of the related art.

An object of the present invention is to provide an A/D converter in which the number of conversion bits is selectively determined and sampling is varied so that fabricating cost is reduced and reliability of the device is improved.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in a first aspect of the present invention there is provided an analog-to-digital converter including a sample and hold circuit for sampling and holding an input analog signal and outputting an analog voltage, a selection code generator for generating a selection code corresponding to an operation mode for a number of conversion bits and a number of samples, a decoder for generating an enable signal corresponding to the selection code, a comparator for comparing an external voltage with the analog voltage and outputting a digital value, a conversion data register for storing the digital value and outputting a final digital value, a digital-to-analog converter for outputting the external voltage by inputting the digital value and a reference voltage stored in the conversion data register, a multiplexer for selecting a signal path for the operation mode selected by the selection code generator, a shift register for determining a number of registers for the operation mode selected by the selection code generator, a counter for counting a number of shifts of the shift register and determining the signal path of the multiplexer, an output detector for detecting a conversion value of a lowest bit of the conversion data register and outputting a conversion end signal to the conversion data register, and a controller for controlling operation of the analog-to-digital converter by outputting a clock signal in response to the selection code and the conversion end signal.

In another aspect of the present invention there is provided an analog-to-digital converter including a storage register for storing a plurality of bits corresponding to a digital value, a digital-to-analog converter for converting the plurality of bits into a first voltage, a sample-and-hold circuit for sampling and holding an input voltage, a comparator for comparing the input voltage with the first voltage and outputting a second voltage to the storage register in response to the comparing, a selection code generator for generating a selection signal corresponding to a number of conversion bits and a number of samples for conversion, a shift register for determining a number of active bits of the storage register in response to the selection signal, an output detector for detecting an end of the conversion by analyzing the plurality of bits and for outputting a conversion end signal, and a controller for generating a clock signal for operation of the shift register and the storage register and for ending the conversion in response to the conversion end signal.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 5 is a table illustrating a method for generating a selection code of an A/D converter of successive-approximation type according to the preferred embodiment of the present invention.

DETAILED DESCRIPTION OF THE PREFERRED EMBODIMENT

Reference will now be made in detail to the preferred embodiment of the present invention, an example of which is illustrated in the accompanying drawings.

Figure 1:
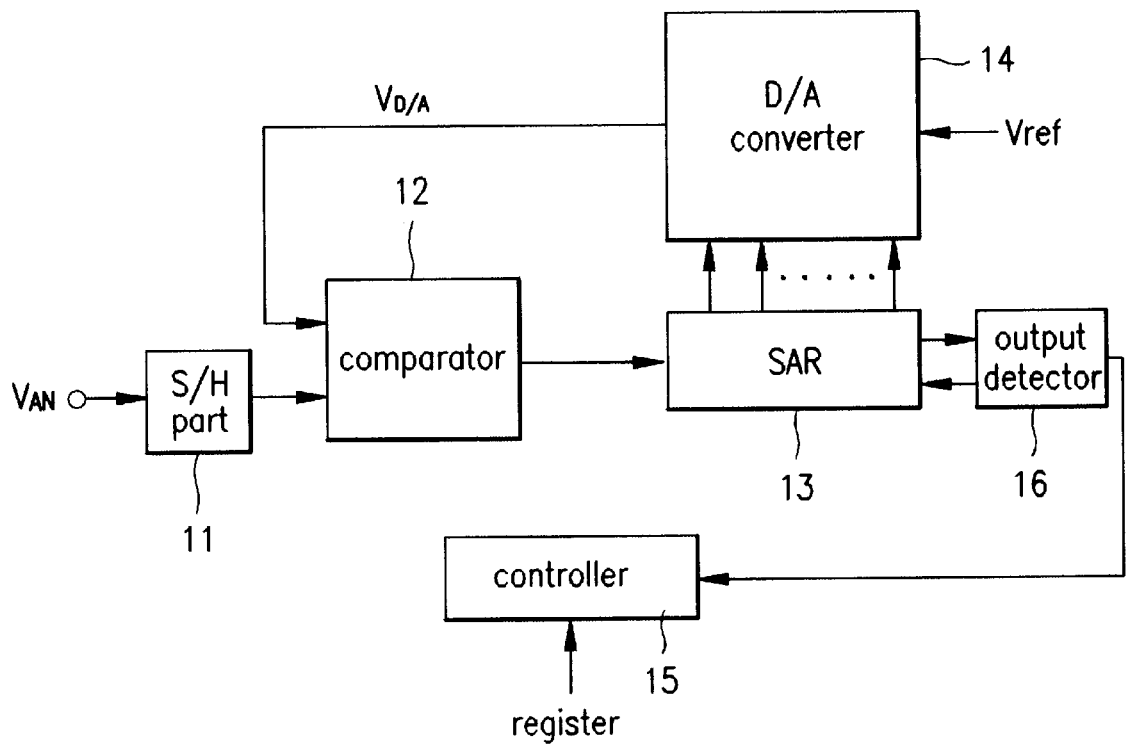
FIG. 1 is a block diagram illustrating a conventional A/D converter of successive-approximation type.
Figure 2:
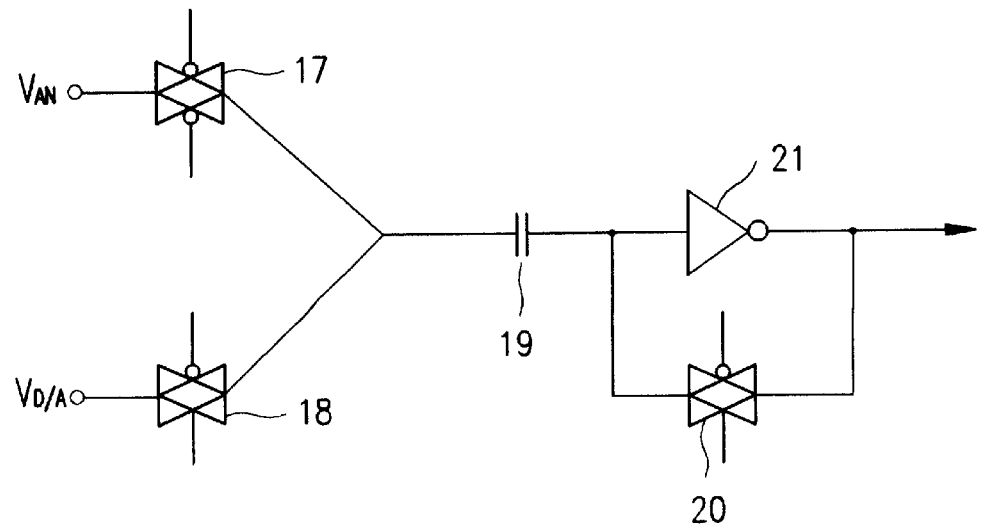
FIG. 2 is a circuit diagram illustrating a comparator of the conventional A/D converter of the successive-approximation type.
Figure 3:
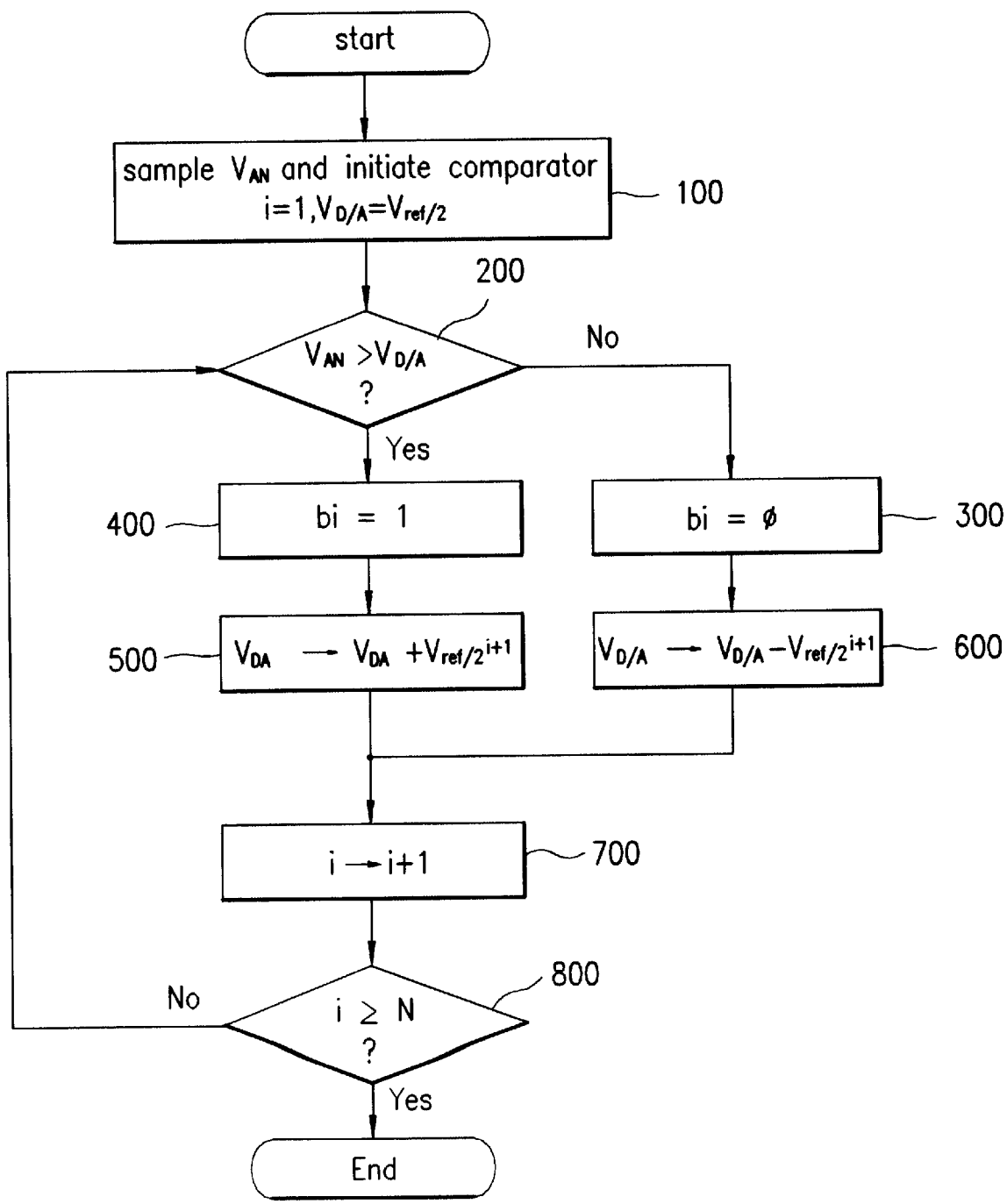
FIG. 3 is a flow chart illustrating operation of the conventional A/D converter of the successive-approximation type.
Figure 4:
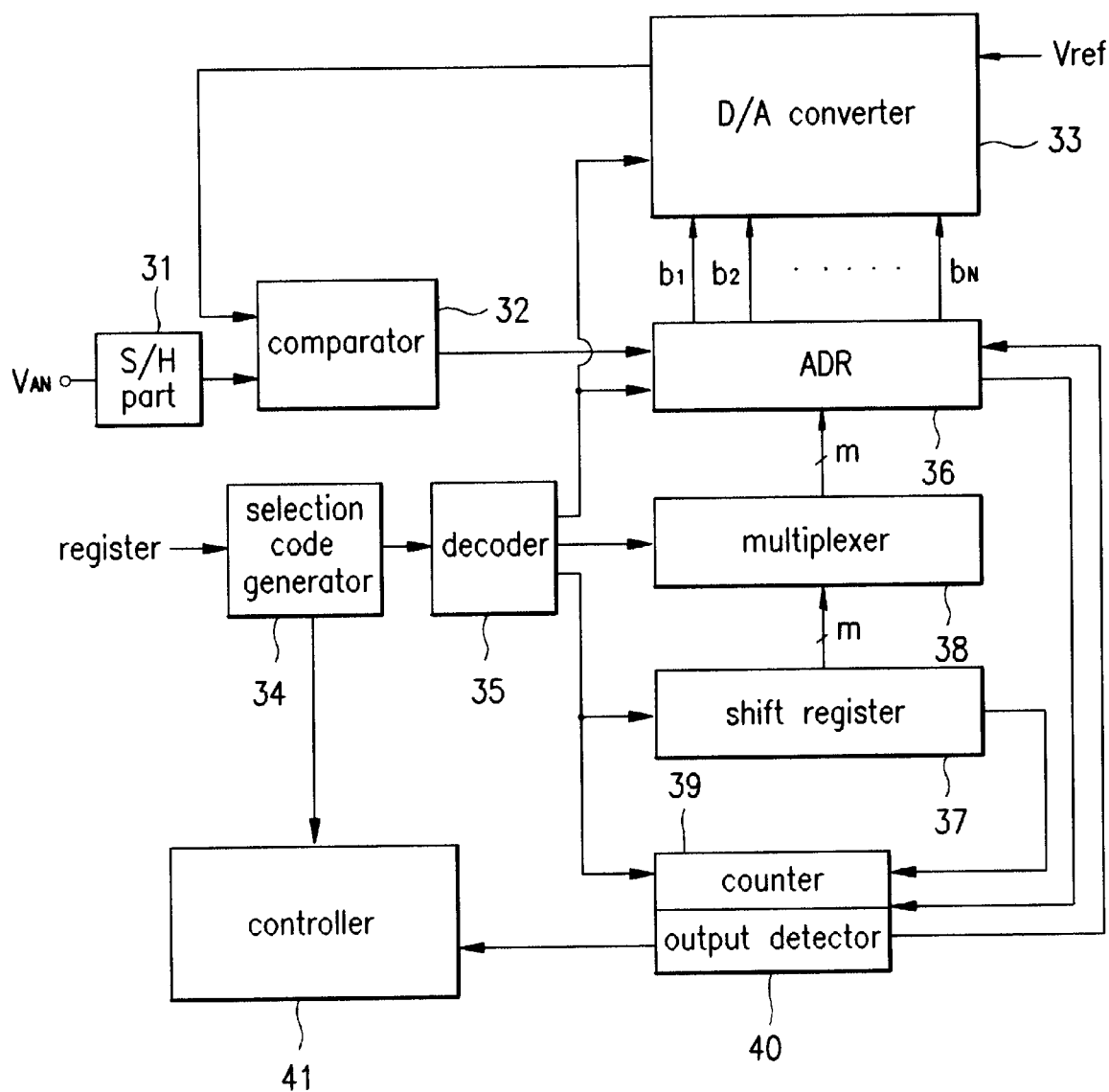
FIG. 4 is a block diagram illustrating an A/D converter of a successive-approximation type according to a preferred embodiment of the present invention.

As shown in FIG. 4, an A/D converter of a successive-approximation type according to the present invention includes an S/H circuit 31, a comparator 32, a D/A converter 33, a selection code generator 34, a decoder 35, an A/D conversion data register (ADR) 36, a shift register 37, a multiplexer 38, a counter 39, an output detector 40, and a controller 41. The S/H circuit 31 samples and holds an input analog signal and outputs an input analog voltage $V_{AN}$. The ADR 36 stores digital values of the comparator 32 and outputs a final digital value by inputting the output of the output detector 40. The D/A converter 33 receives a reference voltage Vref and the digital value of the ADR 36, and decodes the digital value in order to output a digital-to-analog voltage $V_{D/A}$, which will be compared with $V_{AN}$.

The comparator 32 includes a first transfer gate, a second transfer gate, a capacitor, a third transfer gate, and a CMOS inverter, similar to the conventional comparator. The comparator 32 compares $V_{D/A}$ with $V_{AN}$ and outputs the digital value.

An operational amplifier whose negative (−) terminal is connected to $V_{D/A}$ and whose positive (+) terminal is connected to the output data of the S/H circuit 31, may also be used as the comparator 32.

Further, the selection code generator 34 generates a selection code that selects an operation mode of the D/A converter 33 (i.e., the number of conversion bits and the number of analog samples,) by inputting the output of a register controlled by a user. The selection code generator 34 outputs the same to the decoder 35.

The decoder 35 outputs an enable signal corresponding to the selection code of the selection code generator 34 to the D/A converter 33, the ADR 36, the shift register 37, the multiplexer 38, and the counter 39. The decoder 35 controls the number of conversion bits of the ADR 36, where a register string of the D/A converter 33 corresponds to the selected number of conversion bits.

The shift register 37 determines a number of the registers selected by the selection code by inputting the output signal of the decoder 35. The counter 39 counts the number shifts of the selected shift register 37 and determines the path of the multiplexer 38 depending on the selection code.

A number m of the path of the multiplexer 38 is determined by a number of samples M and the number of conversion bits N as follows.

$$m = N \div M$$

The output detector 40 detects a conversion value of the lowest bit of the ADR 36 by inputting the digital values of the ADR 36, and outputs a conversion end signal. The controller 41 outputs a clock signal to control all operations of the A/D converter by inputting the output data of the selection code generator 34 and the output detector 16.

The operation of the A/D converter of the successive-approximation type according to the preferred embodiment of the present invention will be described below.

With all operations controlled by the controller 41, the selection code generator 34 generates a selection code which selects the required number of conversion bits and the number of analog samples.

Figure 6:
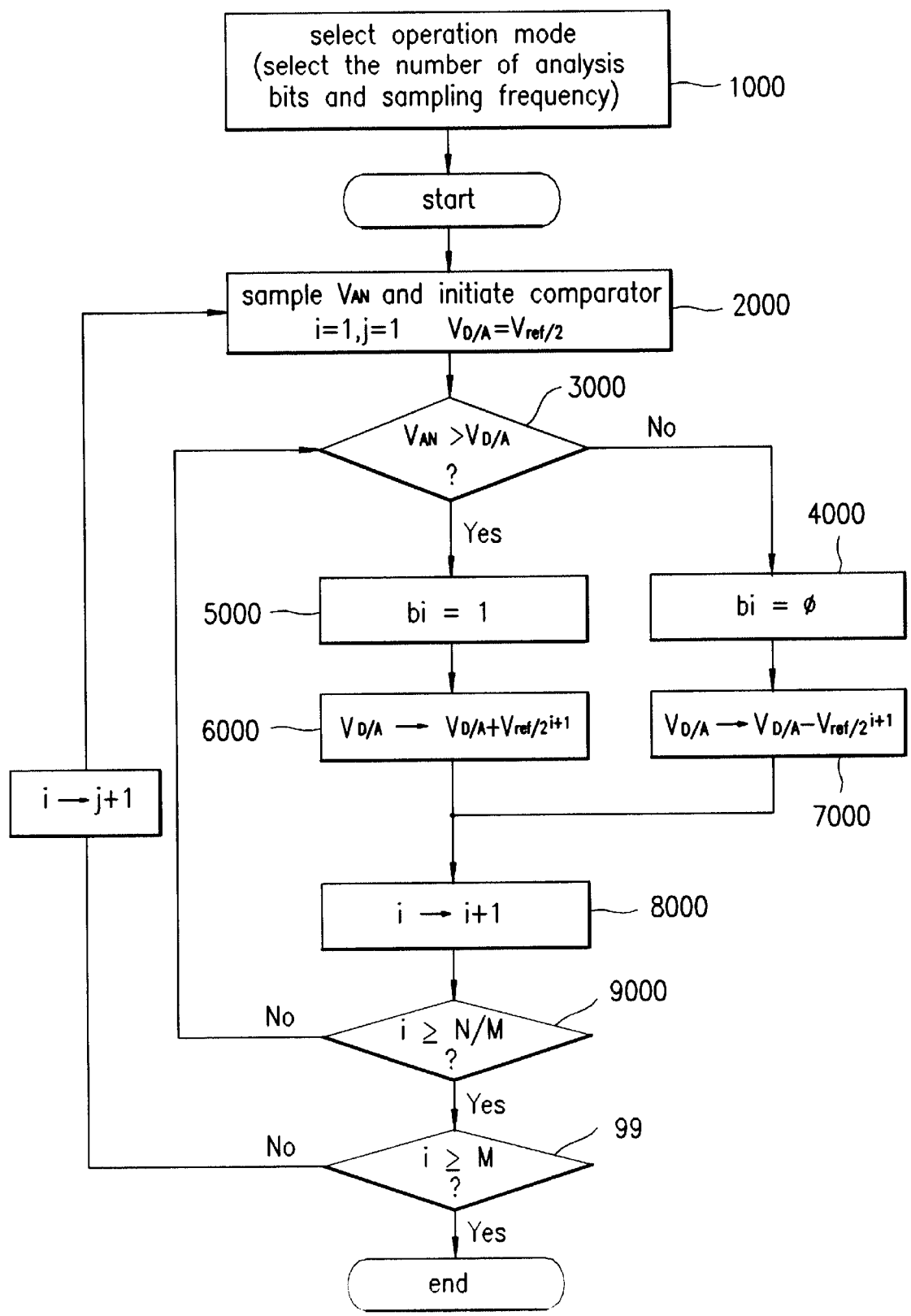
FIG. 6 is a flow chart illustrating operation of the A/D converter of the successive-approximation type according to the preferred embodiment of the present invention.

A method for generating the selection code will be described with reference to FIG. 5. In FIG. 5, the numbers in parentheses represent the number of samples and N represents the number of the digital value bits of the ADR 36. Also, the operation of the A/D converter of the successive-approximation type according to the present invention will be described with reference to FIG. 6.

If the number of conversion bits is 8 and the number of samples j is 2 in step 1000, the decoder 35 controls the shift register 37 for a 4-bit operation.

When the second transfer gate of the comparator 32 is turned off, the S/H circuit 31 samples and holds $V_{AN}$ and the comparator 12 is initiated. During the first sample, that is, while the S/H circuit 31 is sampling ½ of $V_{AN}$, the multiplexer 38 is connected to 4 bits at a high level of the ADR 36. Therefore, the 4-bit shift register of the shift register 37 is connected to 4 bits at the high level of the ADR 36.

The digital value of the ADR 36 is 10000000, which is converted into $V_{D/A}$, that is, Vref/2, by the D/A converter 33 in step 2000.

If the comparator 32 compares $V_{D/A}$ with $V_{AN}$ in step 3000, a high value or a low value is obtained. In other words, if the output of the comparator 32 is high, that is, $V_{D/A} > V_{AN}$, the most significant bit of the SAR 13 becomes "0" in step 4000. If the output of the comparator 32 is low, that is, $V_{D/A} < V_{AN}$, the most significant bit of the SAR 13 becomes "1" in step 5000.

When the output of the comparator 32 is low, the digital value of the ADR 36 is 10000000. $V_{D/A}$ is converted into Vref/2+Vref/4 by the D/A converter 33 in step 6000. When the output of the comparator 32 is high, the digital value of the ADR 36 is 00000000. $V_{D/A}$ is converted into Vref/2–Vref/4 by means of the D/A converter 33 in step 7000. At this time, the counter 39 counts "1" in step 8000.

During the second clock period, the operation is as follows:

First, when the value of the digital value of the ADR 36 after the first clock period is 10000000, the digital value of the ADR 36 becomes 11000000 and $V_{D/A}$ is Vref/2+Vref/4.

The comparator 32 compares $V_{D/A}$ with $V_{AN}$ in step 3000. As a result, a high value or a low value is obtained. If the output of the comparator 32 is high, the digital value of the ADR 36 becomes 10000000. If the output of the comparator 32 is low, the digital value of the ADR 36 becomes 11000000. Meanwhile, if the value of the digital value of the ADR 36 in the first clock period is 00000000, the digital value of the ADR 36 is 01000000 and $V_{D/A}$ is Vref/2–Vref/4.

The comparator 32 compares $V_{D/A}$ with $V_{AN}$ in step 3000. As a result, a high value or a low value is obtained. If the output of the comparator 32 is high, the digital value of the ADR 36 becomes 00000000. If the output of the comparator 32 is low, the digital value of the ADR 36 becomes 01000000.

The counter 39 counts "2" in step 8000. The above steps repeat until the counter 39 counts to "4".

If the count of the counter 39 reaches "4", the S/H circuit 31 samples the remaining half of $V_{AN}$. At this time, the multiplexer 38 is connected to 4 bits at a low level of the ADR 36 and the 4-bit shift register of the shift register 37 is connected to 4 bits at a low level of the ADR 36.

The operation performed during the first sampling period repeats.

During the second sampling period, if the count of the counter 39 reaches "4", the number of conversion bits becomes equal to the determined number of samples (M=2) in step 99. Thus, the output detector 40 outputs the conversion end signal and the ADR 36 outputs the digital value. Finally, the operation of the A/D converter ends.

Meanwhile, since the shift register 37 and the D/A converter 33 are regularly operated in hardware, $2^n$ is selected as the number of conversion bits, where n is either a positive integer or "0". If the number of conversion bits is an odd number, varying bits of the shift register 37 is not efficient. For this reason, the number of samples is limited to the minimum (M) possible (N).

The A/D converter of the present invention has the following advantages.

Since the selection code generator, the decoder, and the counter select the required number of conversion bits and the number of samples depending on a desired conversion precision, the analog voltage may be converted when the precision of the needed conversions is smaller than that determined by the hardware. Therefore, conversion is faster, and the number of switching operations of the transfer gate which receives the output of the D/A converter is reduced. This prevents charge injection from occurring, reduces the fabricating cost and improves reliability of the device.

It will be apparent to those skilled in the art that various modifications and variations can be made in the A/D converter according to the present invention without departing from the spirit or scope of the invention. Thus, it is intended that the present invention covers the modifications and variations of the invention provided they come within the scope of the appended claims and their equivalents.

What is claimed is:

1. An analog-to-digital converter comprising:

a sample and hold circuit for sampling and holding an input analog signal and outputting an analog voltage;

a selection code generator for generating a selection code corresponding to an operation mode for a number of conversion bits and a number of samples;

a decoder for generating an enable signal corresponding to the selection code;

a comparator for comparing an external voltage with the analog voltage and outputting a digital value;

a conversion data register for storing the digital value and outputting a final digital value;

a digital-to-analog converter for outputting the external voltage by inputting the digital value and a reference voltage stored in the conversion data register;

a multiplexer for selecting a signal path for the operation mode selected by the selection code generator;

a shift register for determining a number of registers for the operation mode selected by the selection code generator;

a counter for counting a number of shifts of the shift register and determining the signal path of the multiplexer;

an output detector for detecting a conversion value of a lowest bit of the conversion data register and outputting a conversion end signal to the conversion data register; and a controller for controlling operation of the analog-to-digital converter by outputting a clock signal in response to the selection code and the conversion end signal.

2. The analog-to-digital converter of claim 1, wherein a number of signal paths of the multiplexer is determined by dividing the number of conversion bits by the number of samples.

3. The analog-to-digital converter of claim 1, wherein the number of conversion bits is $2^n$, n being an integer greater than or equal to zero.

4. The analog-to-digital converter of claim 1, wherein the number of samples is limited to a minimum (M) possible if the number of conversion bits is an odd number.

5. An analog-to-digital converter comprising:

a storage register for storing a plurality of bits corresponding to a digital value;

a digital-to-analog converter for converting the plurality of bits into a first voltage;

a sample-and-hold circuit for sampling and holding an input voltage;

a comparator for comparing the input voltage with the first voltage and outputting a second voltage to the storage register in response to the comparing;

a selection code generator for generating a selection signal corresponding to a number of conversion bits and a number of samples for conversion;

a shift register for determining a number of active bits of the storage register in response to the selection signal;

an output detector for detecting an end of the conversion by analyzing the plurality of bits and for outputting a conversion end signal; and a controller for generating a clock signal for operation of the shift register and the storage register and for ending the conversion in response to the conversion end signal.

6. The analog-to-digital converter of claim 5, further including:

a multiplexer for selecting a signal path corresponding to the selection signal; and a counter for counting a number of shifts of the shift register and determining the signal path of the multiplexer.

7. The analog-to-digital converter of claim 6, wherein a number of signal paths of the multiplexer is determined by dividing the number of conversion bits by the number of samples.

8. The analog-to-digital converter of claim 5, wherein the number of conversion bits is $2^n$, n being an integer greater than or equal to zero.

9. The analog-to-digital converter of claim 5, wherein the number of samples is limited to a minimum (M) possible if the number of conversion bits is an odd number.

\* \* \* \* \*